United States Patent [19]

Nicholson

[11] 4,155,036

[45] May 15, 1979

[54] APPARATUS FOR TESTING COOKING RANGE ELECTRICAL CIRCUITRY

[75] Inventor: Dick H. Nicholson, Gas City, Ind.

[73] Assignee: General Connector Corp., Markle, Ind.

[21] Appl. No.: 848,620

[22] Filed: Nov. 4, 1977

[51] Int. Cl.² ..................... G01R 15/12; G01R 31/02
[52] U.S. Cl. .................................. 324/73 R; 324/51
[58] Field of Search .......................... 324/51, 66, 73 R

[56] References Cited

U.S. PATENT DOCUMENTS

| | | | |
|---|---|---|---|
| 2,007,992 | 7/1935 | Wenger | 324/73 R X |
| 2,030,857 | 2/1936 | Dingley | 324/73 R X |
| 2,221,556 | 11/1940 | Roemisch | 324/73 R |
| 3,417,326 | 12/1968 | Harris | 324/51 |
| 3,543,111 | 11/1970 | Harris et al. | 324/73 R |
| 3,551,803 | 12/1970 | Ray | 324/51 |
| 3,590,373 | 6/1971 | Lake | 324/73 R |
| 3,663,939 | 5/1972 | Olsson | 324/51 X |
| 3,890,836 | 6/1975 | McKenzie | 324/73 R X |

FOREIGN PATENT DOCUMENTS 320338 10/1929 United Kingdom ...................... 324/51

Primary Examiner—Gerard R. Strecker
Attorney, Agent, or Firm—Gust, Irish, Jeffers & Rickert

[57] ABSTRACT

A test circuit for testing electrical characteristics of heating elements and switches coupled to individual elements. The switches are manually operated and conventionally may be mounted on a cooking range panel. The switches are operable to place the elements in an energized state wherein they are coupled to an electrical power source and in a deenergized state wherein they are decoupled from such source. The leads from the switches are typically coupled to the leads from the heating elements through a multi-conductor coupling harness wherein one harness segment has a plurality of male connectors and the other harness segment has a plurality of female connectors engageable with the male connectors. A T-connector has a first set of connectors engageable with the male connectors and a second set of connectors engageable with the female connectors and a third set of connectors coupled with the leads of a test circuit. The test circuit has an interlocking switch for providing a switchable connection between one only of the heating elements to its corresponding switch through the test circuit and a visual indicator, such as a neon light, indicates which element and switch are connected through the test circuit. The test circuit has an ohmmeter and ammeter with switches to select one of the meters to test either the resistance of the element-switch circuit or the amperage through the element-switch circuit when in its energized state. Additional switches are provided selectively to couple the ammeter to the power source and certain of the heating elements to the ohmmeter.

3 Claims, 4 Drawing Figures

APPARATUS FOR TESTING COOKING RANGE ELECTRICAL CIRCUITRY

BACKGROUND OF THE INVENTION

1. Field of the Invention

This invention is in the field of appliance testing apparatus and more particularly to testing apparatus for cooking ranges, ovens, and the like.

2. Description of the Prior Art

It is frequently necessary, especially for in-home or on-site repair of domestic cooking ranges, ovens, and the like, to test the circuitry, switches, and heating elements for short circuits, open circuits, and worn or malfunctioning components. By so testing the appliance, the component requiring repair can be accurately identified and the repair function expeditiously performed. A test apparatus for so identifying the area to be repaired is especially useful in those heating appliances having numerous electrical connecting leads, switches, and heating elements. Numerous testing apparatuses have been available in various and diverse uses and for various and diverse devices but a need has existed in the area of appliance testing of cooking ranges, ovens, and the like for a relatively inexpensive, easily connected, and conveniently applied testing apparatus.

SUMMARY OF THE INVENTION

A test apparatus for testing the electrical characteristics of a cooking range and oven or the like, having a plurality of burner elements mounted typically on a range surface and bake-broil elements mounted in an oven. Switches mounted on a range control panel selectively electrically couple the elements to an electrical power source for energizing the resistance elements and causing heat generation therefrom. The elements are in an energized state when their corresponding switches are placed in an active select state coupling the respective elements to the power source. The elements are in a deenergized state when the corresponding switches are manually switched to an "off" state, disconnecting the respective elements from the power source.

Leads connecting the heating elements to their respective switches are coupled through a two-segment disconnectable harness, one segment of the harness having male connectors coupled to each lead to that segment and the other harness segment having female connectors coupled to each lead of that segment. Separation of the segments disconnects all of the leads to each segment from the other segment and joining of the segments to each other connects the leads from each segment to the leads of the other segment.

A T-connector has a first set of male connectors engageable with the female connectors of a harness segment and a second set of female connectors engageable with the male connectors of the other harness segment. Electrical leads connect certain of the male and female connectors in the T-connector and each of the connectors in the T-connector is electrically coupled to a test circuit apparatus. The test circuit apparatus has a plurality of interlocking switches for connecting each of the heating elements through a first switch to either an ohmmeter or an ammeter to selectively measure the resistance of the heating element and its respective switch circuit in the deenergized state and selectively measure the amperage in the heating element and its respective switch in the energized state. The interlocking switch permits only one heating element and its respective switch to be tested at one time and indicator lamps are provided to indicate to the testing operator which element is being tested.

A first switch is provided for connecting the interlock switches to either the ammeter circuit or the ohmmeter circuit and a second switch is provided for connecting a line common to all of the surface burner elements to the ohmmeter in both the energized and deenergized states. Further switches are provided to enable the ammeter and the ohmmeter in the energized state for the common burner connection.

It is an object of this invention to provide a relatively simple, easily connected and disconnected, test apparatus for a cooking range and oven for testing circuit shorts, continuity, and power usage, in both the active and passive states of the range.

It is another object of this invention to provide in the apparatus of the previous object visual indication means indicating which circuit is being tested.

It is a further object of this invention to provide in the apparatus of the previous objects an interlocking switch for testing each individual heating element and switch circuit, and for testing in a common line a plurality of heating elements and switch combinations.

The above-mentioned and other features and objects of this invention and the manner of attaining them will become more apparent and the invention itself will be best understood by reference to the following description of an embodiment of the invention taken in conjunction with the accompanying drawings.

DESCRIPTION OF THE PREFERRED EMBODIMENT

Figure 1:
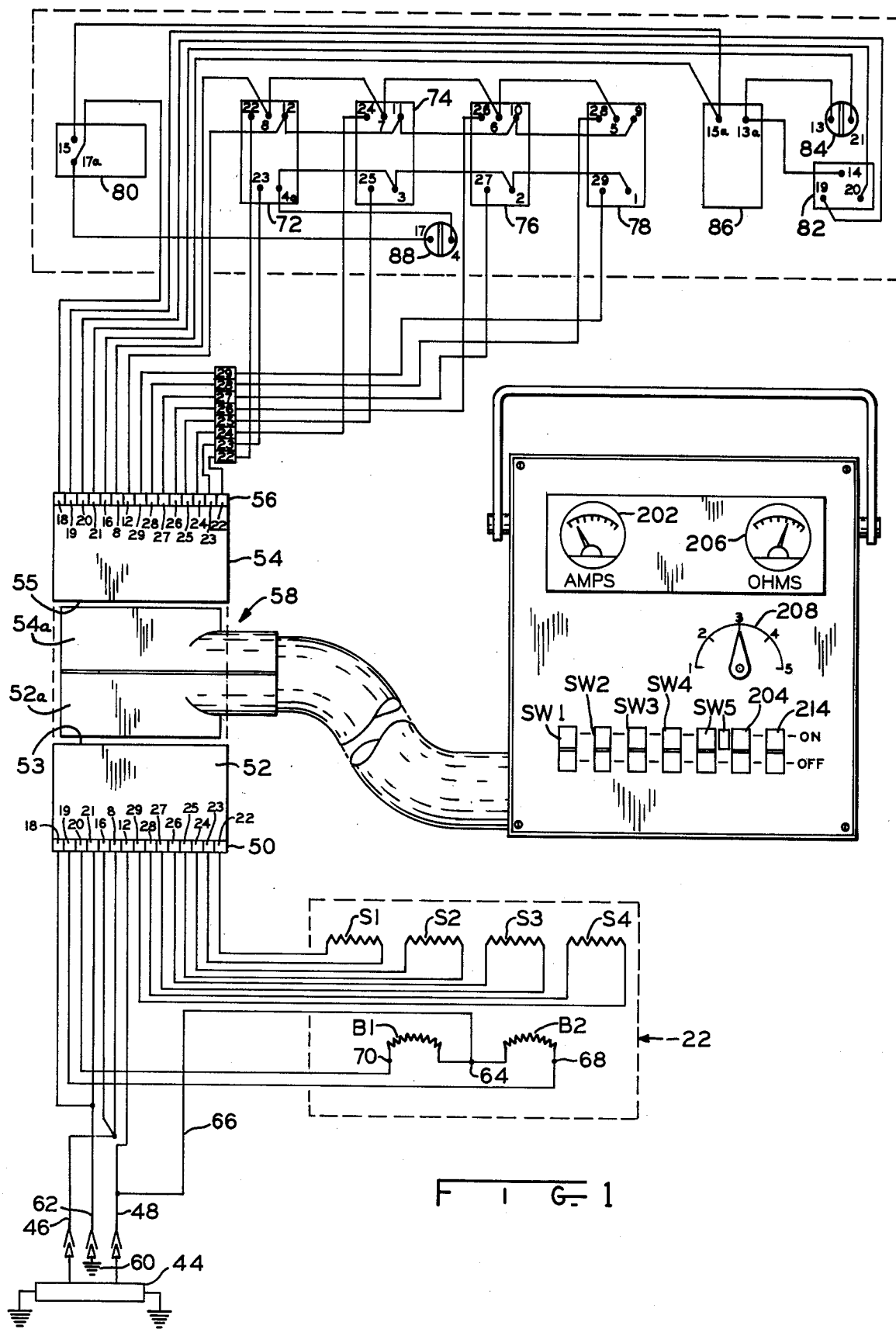
FIG. 1 is a partially diagrammatic schematic circuit of a preferred embodiment of this invention.

Referring to the drawings, and in particular to FIG. 1 of the drawings, a schematic, partially diagrammatic, circuit of a conventional domestic cooking range having four surface heating elements and broil and bake oven heating elements, with a test apparatus of this invention connected therein is shown. The particular range shown is a Kelvinator Model RDE3300 and RDE 3100. Dashed box 22 is a diagrammatic showing of surface heating elements S1, S2, S3, and S4 which are conventional resistance elements as used in commercially available ranges. Also shown is a conventional broil heating resistance element B1 which is conventionally located near the top wall of the range oven and a conventional bake resistance element B2 which is conventionally located near the bottom oven wall. Power source 44 applies 115 volt alternating current between each of lines 46, 48 and line 62, and 230 volts between lines 46 and 48.

Conventional harness socket segment 52, typically of molded plastic material, securely holds each of fifteen sockets, not shown, in place. Segment 52 has at one end terminal block 50 with fifteen terminals 8, 12, 16, and 18 to 29. The sockets in segment 52 are mounted to open outwardly toward end 53 and are electrically connected to respective terminals in block 50. Plug segment 54 has mounted securely therein fifteen plugs, not shown, which open toward end 55 and register with, and are normally insertable into, corresponding socket terminals in segment 52 in conventional fashion. By simply manually grasping segments 52 and 54, all fifteen plugs and sockets may be disassembled by separation of segments 52 and 54, and may be assembled in electrical conductive contact by manually urging together segments 52, 54. Segment 54 has terminal block 56 having fifteen terminals 8, 12, 16 and 18 to 29 electrically connected to respective pins, not shown, in segment 54 such that each plug in segment 54 registers with and will be insertably connected with a socket in segment 52 having a corresponding number when segments 52, 54 are in assembled relation.

Block 50 terminals 18 and 21 are connected to ground 60 through conductor 62 while block 50 terminal 12 is electrically coupled to source 44. The junction 64 between heating elements B1 and B2 is connected to source 44 through line 66. Terminal 68 of element B2 is connected to block 50 terminal 19 while terminal 70 of element B1 is connected to block 52 terminal 20.

Element S1 is connected between block 50 terminals 22 and 23, element S2 is connected between block 50 terminals 24 and 25, element S3 is connected between block 50 terminals 26 and 27, and element S4 is connected between block 50 terminals 28 and 29.

In the circuit of FIG. 1, socket segment 52 is shown connected to a corresponding plug segment 52a of T-connector 58 and plug segment 54 is shown connected to a corresponding socket segment 54a of connector 58, with connector 58 being shown in FIGS. 2 and 3 and later described.

Block 56 terminals 22 to 29 are connected to corresponding range 72 terminals 22 to 29 which, in turn, are connected to corresponding terminals 22 to 29 on switch plates 72, 74, 76, and 78 placed on the range back panel in conventional fashion. Plate 72 has the terminals for a switch, not shown, for surface element S1, plate 74 provides the terminals for a switch, not shown, for surface element S2; plate 76 provides the terminals for a switch, not shown, for surface element S3, and plate 78 provides terminals for a switch, not shown, for surface element S4.

Block 56 terminal 18 is electrically coupled to terminals 17a on clock terminal plate 80, mounted on the back panel of the range and providing terminals for a clock/timer, not shown. Block 56 terminals 19 and 20 are electrically coupled to terminals 19 and 20, respectively on terminal plate 82 which provides the terminals for a switch, not shown, for oven elements B1 and B2. Block 56 terminal 21 is connected to corresponding terminal 21 on plate 84 which is mounted on the range back panel and contains the terminals for the range oven light, not shown. Block 56 terminal 16 is connected to a corresponding terminal 15a on plate 86, mounted on the range back panel, which has the terminals for the oven switch, not shown. Terminal 15a on plate 86 is also electrically coupled to terminal 15 on plate 80 to provide timing for the oven switch in the conventional manner. Terminal 13 on plate 84 is electrically coupled to terminal 13a on plate 86 which in turn is electrically coupled to terminal 14 on plate 82. Terminal 17a on plate 80 is electrically coupled to terminal 17 on plate 88, mounted on the range back panel, which provides terminals for an indicator light, not shown, mounted on the range panel to indicate that the oven elements B1 or B2 are being energized. Terminal 4 on plate 88 is connected to terminal 4a on plate 72.

Figure 3:
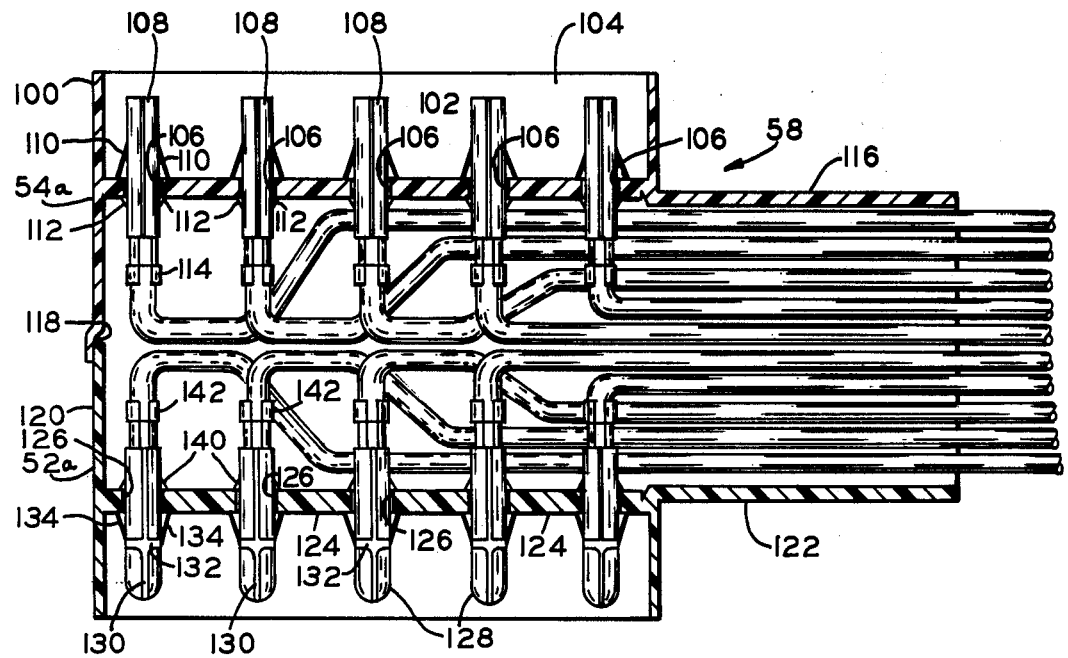
FIG. 3 is a section taken at 3—3 of FIG. 2.
Figure 2:
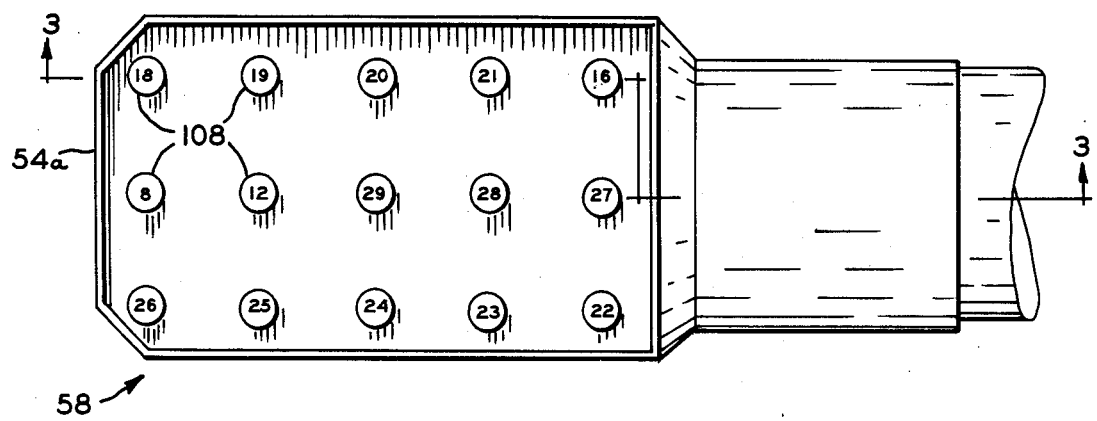
FIG. 2 is a plan elevational view of the female socket portion of the T-connector shown diagrammatically in FIG. 1.

Referring now to FIGS. 2 and 3, T-connector 58 will be described. Segment 54a comprises oblong housing 100 which has shelf 102 affixed therein and spaced from opening 104. Shelf 102 has a plurality of openings 106 for receiving segment 54a sockets 108 numbered 8, 12, 16, and 18 to 29 as previously described. Each socket 108 is comprised of an elongated conductive spring tubular member, such as beryllium copper, having two prongs 110 struck from the sides thereof and protruding radially outwardly. Axially spaced along each socket 108 are radial protrusions 112. End 114 of each socket 108 is crimped to its respective electrical conductor in a conventional well known manner, making electrical contact with the inner conductor and being supported to the outer insulative coating thereof. Each socket 108 is inserted from the inner side of shelf 102, causing prongs 110 to be compressed as they pass through openings 106 and then resiliently expanding outwardly when protrusions 112 engage the inner side of shelf 102 thus securing each socket 108 in its respective position to shelf 102. When in such position, sockets 108 are in registration with the male plugs in segment 54, with the plugs of segment 54 simultaneously insertably engaging the sockets in segment 54a as segments 54 and 54a are moved toward one another.

Housing 100 has extension 116 having a semi-circular cross section. Housing 100 is provided with flared opening 118 at the lower portion thereof. Segment 52a has oblong housing 120 having extension 122 which is semi-circular in cross section and dimensionally corresponds to extension 116. Housing 120 and extension 122 are fittable in opening 118 and extension 116, respectively, and securable therein as with adhesive or a friction fit. Housing 120 has shelf 124, similar in configuration to shelf 102, and having openings 126 formed therein which are in vertical registration with openings 106. Elongated plugs 128, which may be formed of a conductive spring material such as beryllium copper, are provided with longitudinal blades 130 each of which has a transverse cross member 132. Each cross member 132 is provided with prongs 134 which have free ends extending beyond the radial confines of plug 128 and are compressible toward the body of plug 128 during insertion through holes 126. Further, each plug 128 is provided with radially protruding shoulders 140 which abut the inner wall of shelf 124 after plugs 128 have been inserted through openings 126 sufficiently to allow prongs 134 to spring outwardly thus positioning plugs 128 relative shelf 124 and restricting longitudinal movement in either direction.

Plugs 128, as with sockets 108, are provided at their inner ends with members 142 which are crimped to respective electrical leads and make electrical contact with the inner conductive wires of their respective leads and are crimped against the insulation for mechanical support in a manner well known in the art.

As indicated in FIG. 2, there are 15 tubular sockets 108 arranged in three horizontal rows, with five sockets 108 in each row. The sockets 108 are electrically connected, as by the aforementioned crimping, to individual cables with the cable designation for each member 108 appearing centrally thereof as shown in FIG. 2. It is to be understood that the male plugs 128 are similarly arranged in three rows of five plugs each and are connected to cables having corresponding numerical designations. Thus, when the female sockets of segment 52 are inserted over male plugs 128, the segment 52 sockets will be aligned with, and register with, the segment 52a plugs connected to corresponding cables as shown schematically in FIG. 4, later described. In like manner, when the male plugs of harness segment 54 are inserted into female sockets 108, the plug 54 terminals will be connected through corresponding sockets 108 to corresponding cables in T-connector 58, also as shown schematically in FIG. 4.

Figure 4:
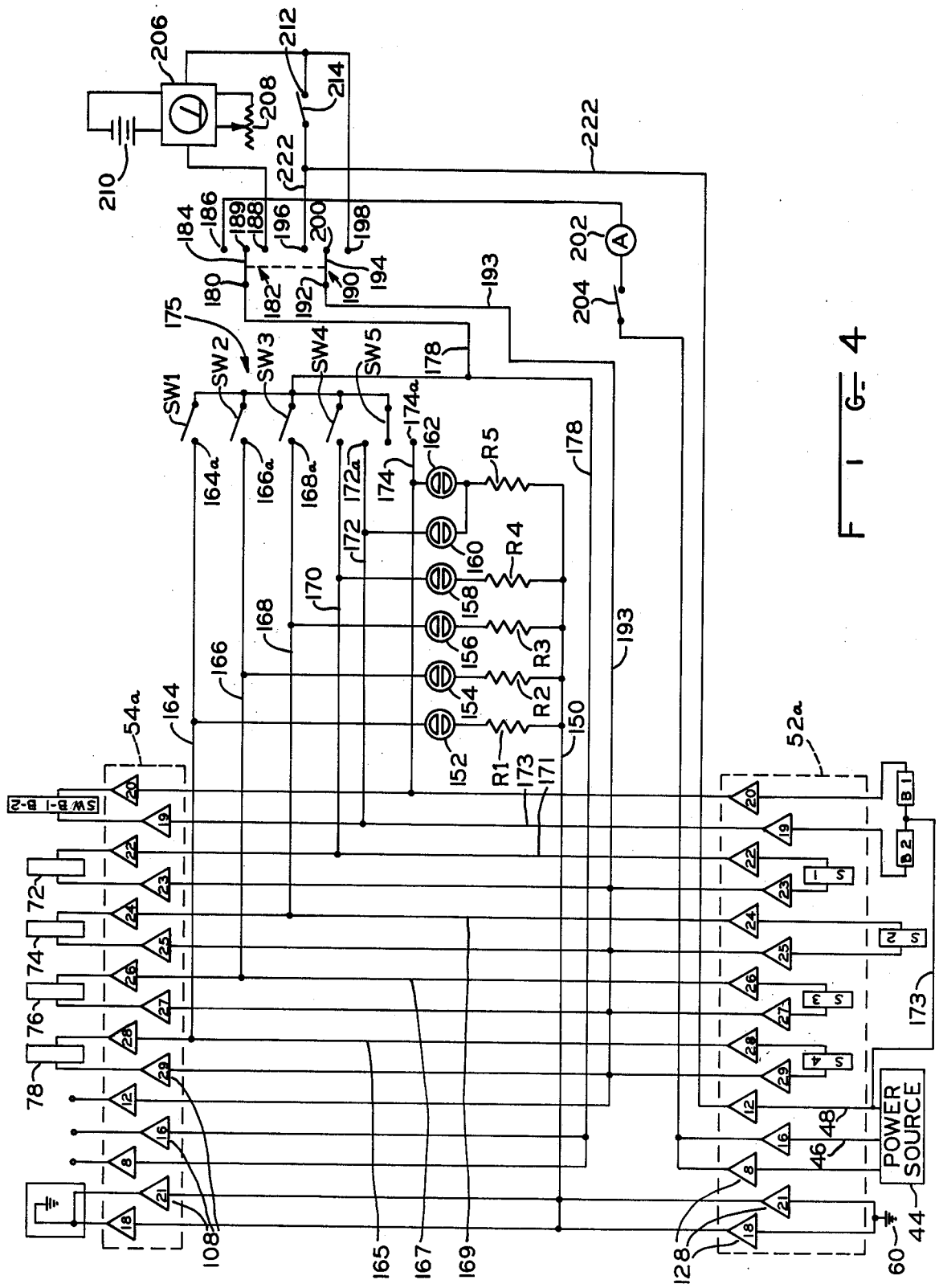
FIG. 4 is a partially diagrammatic circuit schematic of the testing apparatus of a preferred embodiment of this invention.

Referring now to FIG. 4, harness segment 52a of T-connector 58 is shown diagrammatically in dashed box 52a. Plugs 128 are shown diagrammatically and are designated with numerals indicating the lines to which they are electrically coupled with the socket terminals in segment 52, and for the purposes of explaining the circuit in FIG. 4, the connections between each plug 128 and the corresponding range circuitry are shown diagrammatically. Thus, in segment 52a, terminals 18 and 21 are shown coupled to ground 60, terminals 8, 12, and 16 are shown coupled to 230 volt A.C. source 44, terminals 19, and 20 are shown coupled to elements B1 and B2, terminals 22 and 23 are shown coupled to element S1, terminals 24 and 25 are shown coupled to element S2, terminals 26 and 27 are shown coupled to element S3, and terminals 28 and 29 are shown coupled to element S4.

T-connector segment 54a is shown in a dashed box with sockets 108 shown diagrammatically and including the terminal designations to which they connect with the plug terminals in harness segment 54. The connections between plugs 108 and the circuitry in FIG. 1 are also shown diagrammatically: terminals 8, 12, and 16 are connected to provide power through the range switches; terminals 18 and 21 are shown connected to the ground connections for the corresponding range switches and lights; terminals 19 and 20 are shown connected to the switch for elements B1 and B2; terminals 22 and 23 are shown connected to the switch for element S1; terminals 24 and 25 are shown connected to the switch for element S2; terminals 26 and 27 are shown connected to the switch for element S3; and terminals 28 and 29 are shown connected to the switch for element S4.

Ground line 150 is shown coupled through resistances R1, R2, R3, and R4, respectively to first terminals of neon lamps 152, 154, 156, 158, while resistance R5 is coupled between ground line 150 and first terminals of neon lamps 160 and 162. Lamp 152 is connected at its other terminal to line 164 which is coupled between the common line 165 and terminal 28 in segments 52a and 54a and terminal 164a of switch SW-1; the other terminal of lamp 154 is coupled to line 166 which is coupled between the common line 167 and terminals 26 in segment 52a and 54a and terminal 166a of switch SW-2; the other terminal of lamp 156 is coupled to line 168 which is coupled between the common line 169 and terminals 24 in segment 52a and 54a and terminal 168a of switch SW-3; the other terminal of lamp 158 is connected to line 170 which is coupled between the common line 171 and terminals 22 in segments 52a and 54a and terminal 170a of switch SW-4; the other terminal of lamp 160 is connected to line 172 which is coupled between the common line 173 and terminals 19 in segments 52a and 54a and terminal 172a of switch SW-5; and the other terminal of lamp 162 is connected to line 174 which is coupled between the common line 175 and terminals 20 in segments 52a and 54a and a second terminal 174a of switch SW-5. Switches SW-1 to SW-5 are of a conventional interlock switch 175, wherein closing of one switch will automatically open all the other switches so that only one switch at one time may be closed. Switches SW-1 to SW-4 are single pole single throw switches while switch SW-5 is a single pole double throw switch. The pole terminals of switches SW-1 to SW-5 are connected to common line 178, connected at one end to terminals 8 and 16 in segment 54a and connected at its other end to the pole 180 of single pole double throw switch 182 having blade 184 and terminals 186, 188 and "off" position 189. Switch 182 is ganged to a second single pole double throw switch 190 having pole 192, blade 194, and terminals 196, 198, and "off" position 200. Terminal 186 is coupled through ammeter 202 and switch 204 to terminals 8 and 16 in plug 52a. Terminal 188 is coupled through ohmmeter 206, which has sensitivity potentiometer 208 and battery 210 coupled thereto in conventional fashion, to terminal 212 of switch 214 and to terminal 198. Switch 214 is coupled to terminal 196 of switch 190 and terminal 12 in segment 52a. Pole 192 of switch 190 is coupled to terminals 23, 25, 27, 29, and 12 in segment 54a.

In operation of the test apparatus, FIG. 4, continuity of circuit lines, shorts, and open circuits, can be checked by placing blades 184 and 194 of switches 182, 190 on terminals 188 and 198 respectively. With this connection, ohmmeter 206 is enabled and is connected between common line 176 of interlock switch 175 and line 193 which is common to terminals 12, 23, 25, 27, and 29 in segment 54a and terminals 23, 25, 27, and 29 in segment 52a. Thus, any one of switches SW-1 to SW-5 may be operated and the corresponding switch and heating element circuit will be tested for continuity, shorts, and open circuits. For example, if switch SW-1 is depressed, a circuit is completed through line 164, terminal 28 in segment 54a, the range switch for element S4, terminal 29 in segment 54a, line 193, switch 190, and the other side of ohmmeter 206. At the same time, a circuit would be completed between line 164, terminal 28 in segment 52a, heating element S4, terminal 29 in segment 52a, and line 193 through switch 190 and the other side of ohmmeter 206.

The reading of the ohmmeter will indicate the circuit condition for the range switch and heating element, and circuit connections, for elements S4. At this time, a circuit is also completed between line 164 through lamp 152, resistance R1, and ground line 150, illuminating lamp 152 to indicate to the user that circuit which is being tested. In similar manner, when switches SW-2 to SW-5 are closed, their respective switch, coupling lines, and heating elements will be tested through ohmmeter 206, with the respective lamps 154 to 162 being illuminated to indicate circuit operation. As mentioned, switch 175 is an interlocking switch so that only one switch at one time may be closed. When switch SW-5 is switched to terminal 172a, a circuit is completed through line 172, terminal 19 in segment 52a, "bake" heating element B2, line 173, to power source 44. When source 44 is "off" in a deenergized condition, continuity will be checked, and as later explained, when source 44 is "on" and the test circuit is in an energized condition, the amperage under load will be tested.

To test in an energized condition, when power is being applied to the heating elements, switches 182 and 190 are manually operated to place blades 184 and 194 in contact with terminals 186 and 196 respectively. Further, switch 204 is closed. Power from source 44 is applied through the range switches and switches SW-1 to SW-5 are closed as before, making the connections as before, illuminating lamps 152 to 162 depending on which switch is closed. However, in this mode of operation, line 178 is connected through switch 180 to line 220 and through ammeter 202, and line 193 is connected through switch 190 to line 222 which is connected to terminal 12 in segment 52a and to power source 44. Closing of each of switches SW-1 to SW-4 will close circuits, as previously described, through the range switches for heating elements S1 to S4 and through the individual elements S1 to S4, depending on which switch SW-1 to SW-4 is closed, to measure the current flow during active conditions, thus detecting range switch, coupling line, and resistance element failure under power. Switch 214 is connected through line 222 to terminal 12 of segment 52a and power source 44 and in the closed position, assuming blade 184 is in contact with terminal 188, will measure the voltage of power source 44. When blades 184 and 194 are in contact respectively with terminals 189 and 200, switches 182 and 190 are in the "off" condition.

While there have been described above the principles of this invention in connection with specific apparatus, it is to be clearly understood that this description is made only by way of example and not as a limitation to the scope of the invention.

What is claimed is:

1. Test apparatus for testing in the electrical circuitry of a cooking range the electrical characteristics of surface and oven heating elements, switches, and connections between said elements and switches, said circuitry including means for selectively applying an electrical power source to individual ones of said elements through said connections and switches; first and second sets of electrical leads coupled respectively to the heating elements and switches, and connector means having first and second parts for coupling said first and second sets of leads in disconnectable relation; said test apparatus comprising:

a T-connector having a first set of connectors engageable with said first connector part and a second set of connectors engageable with said second connector part; and test circuit means for testing electrical characteristics of selected ones of said elements and associated connections and switches in deenergized and energized states of said elements; said T-connector having a third set of connectors for electrically coupling said first and second connectors to said test circuit means; said test circuit means comprising interlock switch means including a plurality of first switch means for respectively providing a connection between a selected one of said elements and its associated connections and switches, and said third set of connectors, said interlock switch means including means for opening the remaining first switch means when a respective first switch means is closed; an ohmmeter; second switch means for selectively connecting said ohmmeter to said interlock switch means for testing continuity of circuit lines, shorts, and open circuits under deenergized element conditions; an ammeter; and third switch means for selectively connecting said ammeter to said interlock switch means for determining the current flow in said selected element, switch, and associated circuitry, and for testing circuit continuity, shorts, and open circuits under energized element conditions, said third switch means being coupled to said second switch means so that only one at a time of said second and third switch means is closed.

2. The apparatus of claim 1 wherein said test circuit means further comprises fourth switch means for selectively coupling said power source to said ohmmeter for testing said power source.

3. The apparatus of claim 1 further comprising means for visually indicating which of said elements and associated element connections and switches has been connected by said interlock switch means to said test circuit means.

* * * * *